(12) United States Patent
Liang et al.

(10) Patent No.: US 6,890,816 B2
(45) Date of Patent: May 10, 2005

(54) COMPOUND SEMICONDUCTOR STRUCTURE INCLUDING AN EPITAXIAL PEROVSKITE LAYER AND METHOD FOR FABRICATING SEMICONDUCTOR STRUCTURES AND DEVICES

(75) Inventors: Yong Liang, Gilbert, AZ (US); Ravindranath Droopad, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/359,879

(22) Filed: Feb. 7, 2003

(65) Prior Publication Data

US 2004/0157357 A1 Aug. 12, 2004

(51) Int. Cl.[7] .................... H01L 21/8242; C30B 11/00; C30B 23/00; C23C 16/00; C23C 14/00
(52) U.S. Cl. .................... 438/252; 438/479; 438/493; 438/495; 438/938; 427/255.27; 427/255.31; 117/70; 117/90
(58) Field of Search .................... 438/22, 252, 758, 438/479, 493, 495, 938; 117/2, 56, 90, 70; 427/255.27, 255.31

(56) References Cited

U.S. PATENT DOCUMENTS

| | | | |
|---|---|---|---|
| 5,141,894 A | * 8/1992 | Bisaro et al. | 427/132 |
| 5,225,031 A | * 7/1993 | McKee et al. | 428/471 |
| 5,482,003 A | * 1/1996 | McKee et al. | 117/108 |
| 6,022,410 A | * 2/2000 | Yu et al. | 117/103 |
| 6,113,690 A | * 9/2000 | Yu et al. | 117/84 |
| 6,392,257 B1 | * 5/2002 | Ramdani et al. | 257/190 |
| 6,472,694 B1 | * 10/2002 | Wilson et al. | 257/189 |
| 6,524,651 B2 | * 2/2003 | Gan et al. | 427/255.27 |

OTHER PUBLICATIONS

Bum Ki Moon et al, "Role of buffer layers in epitaxial lgrwoth of SrTiO3 films on silicon substrates", Mar. 1994, Japanese journal Of Applied Physics , Part I , vol. 33, No. 3A, p1472–7.*

Hon et al., "Initial growth of a Ga2O3(Gd2O3) on GaAs: key to the attainmnet of a low interfacial density of states," Applied physics letters, vol. 76, No. 3, pp. 312–314.

Hong et al., "Characteristics of Ga2O3(Gd2O3)/GaAs interface: structures and compositions," J. Vac. Sci. Technol. B 18(3), pp. 1688–1691.

Hong et al., "Structural properties og Ga2O3(Gd2O3)–GaAs interfaces," J. Vac. Sci. Technol. B16(3), pp. 1395–1397.

Kwo et al., "Passivation of GaAs using gallium–gadolinium oxides," J. Vac. Sci. Technol. B17(3), pp. 1294–1296.

Kortan et al., "Structure of epitaxial Gd2O3 films grown on GaAs(100)," Physical Review B, vol. 60, No. 15, pp. 10 913–10 918.

Kortan et al. "New phase formation of Gd2O3 films on GaAs(100)," J. Vac. Sci. Technol. B19(4), pp. 1434–1438.

Steiner et al., "Structural modifications of the Gd2O3(110) films on GaAs(100)," Physical Review B, vol. 62, No. 16, pp. 10 614–10 617.

Robey et al. "Interfacial reaction effects in the growth of MgO on GaAs(001) by reactive molecular beam epitaxy," J. Vac. Sci. Technol. A16(4), pp. 2423–2428.

Nishita et al., "Growth of NiO films on various GaAs faces via electron bombardment evaporation," J. Vac. Sci. Technol. A 19(5), pp. 2282–2286.

* cited by examiner

*Primary Examiner*—Howard Weiss
*Assistant Examiner*—Shrinivas Rrao

(57) ABSTRACT

High quality epitaxial layers of monocrystalline perovskite materials (18) can be grown overlying monocrystalline substrates (12) such as gallium arsenide wafers by forming a metal template layer (16) on the monocrystalline substrate. The structure includes a metal-containing layer (16) to mitigate unwanted oxidation of underlying layers and a low-temperature seed layer (19) that prevents degradation of an epitaxial layer (14) during growth of the perovskite layer (18).

6 Claims, 7 Drawing Sheets

COMPOUND SEMICONDUCTOR STRUCTURE INCLUDING AN EPITAXIAL PEROVSKITE LAYER AND METHOD FOR FABRICATING SEMICONDUCTOR STRUCTURES AND DEVICES

FIELD OF THE INVENTION

This invention relates generally to semiconductor structures and devices and to a method for their fabrication, and more specifically to compound semiconductor structures and devices and to the fabrication and use of compound semiconductor structures, devices, and integrated circuits that include an epitaxial perovskite layer.

BACKGROUND OF THE INVENTION

Semiconductor devices often include multiple layers of conductive, insulating, and semiconductive layers. Often, the desirable properties of such layers improve with the crystallinity of the layer. For example, the electron mobility and electron lifetime of semiconductive layers improve as the crystallinity of the layer increases. Similarly, the free electron concentration of conductive layers and the electron charge displacement and electron energy recoverability of insulative or dielectric films improve as the crystallinity of these layers increases.

For many years, attempts have been made to grow various monocrystalline oxides on compound semiconductor materials such as gallium arsenide (GaAs). For example, gadolinium oxide ($Gd_2O_3$) has been grown overlying GaAs using ultra high vacuum e-beam techniques. Although epitaxial oxide layers can be formed overlying GaAs using this technique, the films are typically of relatively poor quality and therefore can only by grown to a limited thickness. Similarly, nickel oxide (NiO) and magnesium oxide (MgO) have been epitaxially grown on GaAs, but these oxide layers tend to turn polycrystalline when grown beyond a relatively thin layer. The attempts to grow monocrystalline oxides over compound semiconductor materials have generally been unsuccessful because lattice mismatches between the host crystal and the grown oxide have caused the resulting layer of monocrystalline material to be of low crystalline quality.

If a large area thin film of high quality monocrystalline oxide material were available at low cost, a variety of semiconductor devices could advantageously be fabricated using the material, taking advantage of the superior film properties resulting from the monocrystalline structure. In particular, the dielectric, optical, magnetic, chemical, piezoelectric and similar properties of a material generally improve as the crystallinity of the material increases.

Accordingly, a need exists for a semiconductor structure that provides a high quality monocrystalline film or layer over another monocrystalline material and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
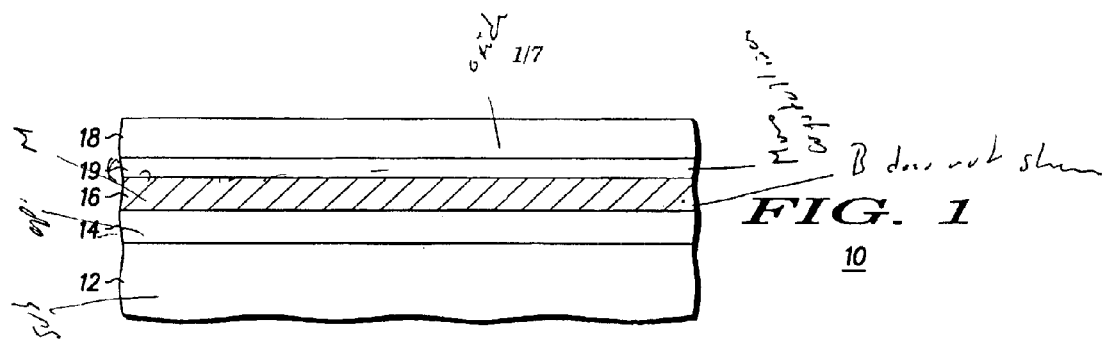
FIG. 1 illustrates schematically, in cross section, a device structure in accordance with an exemplary embodiment of the invention.

FIG. 1 illustrates schematically, in cross section, a portion of a semiconductor structure 10 in accordance with an embodiment of the invention. Semiconductor structure 10 includes a monocrystalline substrate 12, an epitaxial material layer 14 comprising a monocrystalline material, a metallic template layer 16, and a perovskite material layer 18. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 10 also includes a seed layer 19 between template layer 16 and perovskite material layer 18. As will be explained more fully below, the template and seed layers help to initiate the growth of the monocrystalline perovskite material layer overlying substrate 12.

Substrate 12, in accordance with an embodiment of the invention, is a monocrystalline compound semiconductor wafer, as used in compound semiconductor device manufacturing. Exemplary compound semiconductor materials include Group IIIA and VA elements (III-V semiconductor compounds), mixed III-V compounds, Group II (A or B) and VIA elements (II-VI semiconductor compounds), mixed II-VI compounds, Group IV and VI elements (IV-VI semiconductor compounds), and mixed IV-VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe), gallium nitride (GaN), Indium arsenide (InAs), indium antimonide (InSb), and the like.

Epitaxial material layer 14 is a monocrystalline material layer that is epitaxially grown overlying substrate 12. In accordance with various embodiments of the invention, layer 14 comprises the same material as substrate 12. By way of particular example, when substrate 12 comprises GaAs, layer 14 is an epitaxially layer comprising GaAs grown overlying substrate 12. In this case where substrate 12 and layer 14 are both GaAs, the surface of layer 14 can be terminated with either Ga or with As to provide a surface for subsequent epitaxial growth. Growing epitaxial material layer 14 overlying substrate 12 provides a smooth, relatively contaminant free surface for subsequent processing. Although layer 14 can be grown to any desired thickness, layer 14 is preferably more than about 100 nm thick.

Suitable layer 16 materials chemically bond to the surface of the epitaxial layer 14 at selected sites and provide sites for the nucleation of the epitaxial growth of seed layer 19. In accordance with various exemplary embodiments of the invention, template layer 16 includes material from epitaxial layer 14 and deposited material selected to reduce or eliminate oxidation of material layer 14. For example, when layer 14 comprises GaAs, titanium may be deposited onto the GaAs surface to form a template layer including Ti—Ga, Ti—As, Ti—Ga—O, Ti—As—O, or any combination thereof. Other materials suitable for template layer 16 formation include zirconium, hafnium, aluminum, and cobalt. An exemplary thickness of template layer 16 ranges from about 0 to about 10 monolayers and preferably about 0.5 to about 2 monolayers.

Forming template layer 16 of a material that prevents or at least reduces oxidation of material of layer 14 is important for several reasons. In the specific case of GaAs, GaAs readily oxidizes, whether the layer is terminated with gallium or arsenic. An oxidized GaAs surface is amorphous, and thus inhibits or prevents epitaxial growth over the underlying material layer. Deposition of a metal such as titanium is used to form a template for subsequent material layer growth, while preventing undesired oxidation of layer 14.

Seed layer 19 is preferably formed of the same material used to form perovskite material layer 18. Both seed layer 19 and material layer 18 include a monocrystalline perovskite material (e.g., an oxide or nitride material) selected for its crystalline compatibility with underlying substrate 12. Materials that are suitable for the layers 18 and 19 include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and other perovskite oxide materials. Additionally, various nitrides such as gallium nitride, aluminum nitride, and boron nitride may also be used for the layer 18. Most of these materials are insulators, although strontium ruthenate, for example, is a conductor. Generally, these materials are metal oxides or metal nitrides, and more particularly, these metal oxides or nitrides typically include at least two different metallic elements. In some specific applications, the metal oxides or nitrides may include three or more different metallic elements.

The following non-limiting, illustrative examples illustrate various combinations of materials useful in structure 10 in accordance with various alternative embodiments of the invention. These examples are merely illustrative, and it is not intended that the invention be limited to these illustrative examples.

EXAMPLE 1

In accordance with one embodiment of the invention, monocrystalline substrate 12 is a gallium arsenide substrate (001) oriented. The substrate can be, for example, a gallium arsenide substrate as is commonly used in making gallium arsenide integrated circuits having a diameter of about 50–150 mm. In accordance with this embodiment of the invention, perovskite material layer 18 and seed layer 19 are monocrystalline layers of $Sr_zBa_{1-z}TiO_3$ where z has a value between 0 and 1. The lattice structure of the resulting crystalline oxide exhibits a substantially 45 degree rotation with respect to the substrate lattice structure. The perovskite material layer can have a thickness of about 0.2 to about 100 nanometers (nm) and preferably has a thickness of about 5 nm, depending on the desired electrical and optical properties of the layer. In this example, template layer 16 comprises about 0.5 monolayer of titanium.

EXAMPLE 2

In accordance with a further embodiment of the invention, monocrystalline substrate 12 comprises compound semiconductor materials in an indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP). In this case, perovskite material layer 18 is a monocrystalline oxide of strontium or barium zirconate or hafnate in a cubic or orthorhombic phase. Layer 18 can have a thickness of about 0.2–100 nm and preferably has a thickness of at least 4 nm to ensure adequate crystalline and surface quality and is formed of monocrystalline $SrZrO_3$, $BaZrO_3$, $SrHfO_3$, $BaSnO_3$ or $BaHfO_3$. The lattice structure of the resulting crystalline oxide exhibits a substantially 45 degree rotation with respect to the substrate lattice structure.

A suitable template for this structure is about 0–10 monolayers of one of a material M-N and a material M-O-N, wherein M is selected from at least one of Zr, Hf, Ti, Sr, and Ba; and N is selected from at least one of As, P, Ga, Al, and In. Alternatively, the template may comprise 0–10 monolayers of zirconium-arsenic (Zr—As), zirconium-phosphorus (Zr—P), hafnium-arsenic (Hf—As), hafnium-phosphorus (Hf—P), and preferably 0.5–2 monolayers of one of these materials. The resulting lattice structure of the perovskite material layer exhibits a substantially 45 degree rotation with respect to the substrate lattice structure and a lattice mismatch between the substrate and the perovskite material layer of less than 2.5%, and preferably less than about 1.0%.

EXAMPLE 3

In accordance with a further embodiment of the invention, a structure is provided that is suitable for the growth of an epitaxial perovskite film overlying a substrate comprising a II-VI material. Exemplary II-VI compound semiconductor materials include zinc selenide (ZnSe) or zinc sulfur selenide (ZnSSe).

In accordance with this example, perovskite layer 18 is $Sr_xBa_{1-x}TiO_3$, where x has a value between 0 and 1, and has a thickness of about 2–100 nm. The lattice structure of the resulting crystalline oxide exhibits a substantially 45 degree rotation with respect to the substrate lattice structure. A suitable template for this material system includes 0–10 monolayers of zinc-oxygen (Zn—O) followed by 0.5–2 monolayers of an excess of zinc followed by the selenidation of zinc on the surface. Alternatively, a template can be, for example, 0.5–10 monolayers of strontium-sulfur (Sr—S) followed by the ZnSSe.

Referring again to FIG. 1, substrate 12 is a compound semiconductor substrate such as a monocrystalline gallium arsenide substrate. The crystalline structure of the monocrystalline substrate is characterized by a lattice constant and by a lattice orientation. As used herein, lattice constant refers to the distance between atoms of a cell measured in the plane of the surface. In similar manner, perovskite material layer 18 is also a monocrystalline material and the lattice of that monocrystalline material is characterized by a lattice constant and a crystal orientation. The lattice constants of layer 18 and monocrystalline substrate 12 must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 2:
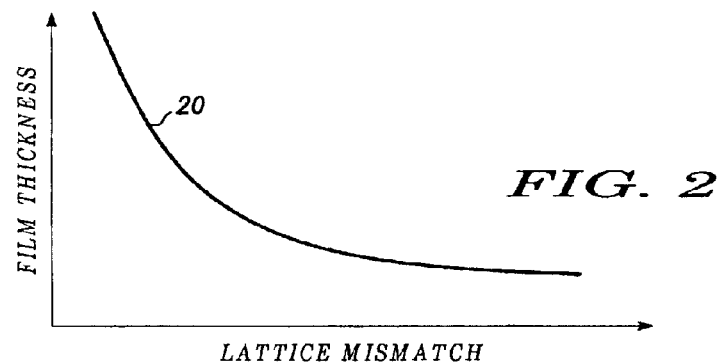
FIG. 2 illustrates graphically the relationship between maximum attainable film thickness and lattice mismatch between a host crystal and a grown crystalline overlayer.

FIG. 2 illustrates graphically the relationship of the achievable thickness of a grown crystal layer of high crystalline quality as a function of the mismatch between the lattice constants of the host crystal and the grown crystal. Curve 20 illustrates the boundary of high crystalline quality material. The area to the right of curve 20 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly.

In accordance with one embodiment of the invention, substrate 12 is a (001) oriented monocrystalline gallium arsenide wafer and perovskite material layer 18 is a layer of strontium barium titanate (Sr,Ba)TiO$_3$. Substantial (i.e., effective) matching of lattice constants between these two materials is achieved by rotating the crystal orientation of the titanate material by approximately 45° with respect to the crystal orientation of the gallium arsenide substrate wafer. As a result, in accordance with an embodiment of the invention, a high quality, thick, monocrystalline titanate layer 18 is achievable.

Figure 3:
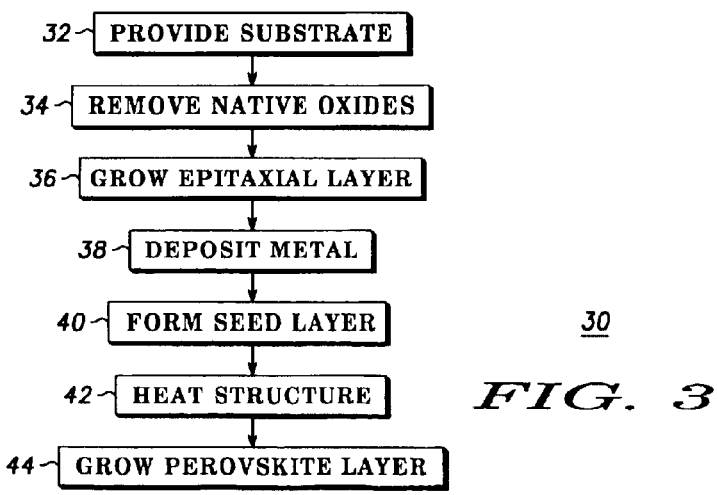
FIG. 3 illustrates a process for forming a structure in accordance with the present invention.
Figure 4:
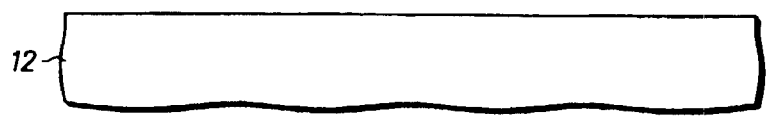
FIGS. 4–7 illustrate intermediate structures formed during the process illustrated in FIG. 3.
Figure 5:
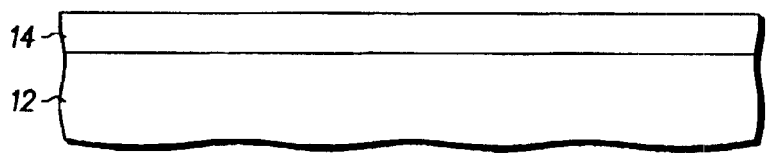

FIGS. 3–7 illustrate a process 30, in accordance with one embodiment of the invention, for fabricating a semiconductor structure such as the structure depicted in FIG. 1. The process starts by providing a monocrystalline semiconductor substrate 12 (step 32), as illustrated in FIGS. 3 and 4. In accordance with a preferred embodiment of the invention, the semiconductor substrate is a gallium arsenide wafer having a (100) orientation. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare gallium arsenide is highly reactive and readily forms a native oxide. The term "bare" is intended to encompass such a native oxide.

In order to epitaxially grow a monocrystalline oxide layer overlying the monocrystalline substrate, the native oxide layer must first be removed to expose the crystalline structure of the underlying substrate (step 34). The following process is preferably carried out by molecular beam epitaxy (MBE), although other epitaxial processes may also be used in accordance with the present invention. The native oxide can be removed by heating substrate to a temperature of about 550° C. to about 620° C. and preferably to about 580° C. in the presence of an arsenic flux.

It is understood that precise measurement of actual temperatures in MBE equipment, as well as other processing equipment, is difficult, and is commonly accomplished by the use of a pyrometer or by means of a thermocouple placed in close proximity to the substrate. Calibrations can be performed to correlate the pyrometer temperature reading to that of the thermocouple. However, neither temperature reading is necessarily a precise indication of actual substrate temperature. Furthermore, variations may exist when measuring temperatures from one MBE system to another MBE system. For the purpose of this description, typical pyrometer temperatures will be used, and it should be understood that variations may exist in practice due to these measurement difficulties.

Following the removal of the oxide from the surface of the substrate, in accordance with one embodiment of the invention, the substrate is cooled to a temperature in the range of about 300–600° C., preferably about 550° C., and an epitaxial layer of GaAs 14 is grown on substrate 12 layer by molecular beam epitaxy (step 36). The MBE process is initiated by opening the shutter in the MBE apparatus to expose gallium in the presence of arsenic flux. The surface of layer 14 can terminate with either gallium (4×2, 6×2, or 3×2 surface structure) or arsenic (2×4 or 4×4 surface structure). Epitaxial layer 14 provides a relatively smooth, well-constructed, contaminant free surface for subsequent processing. Step 36 may be carried out in the same reaction apparatus used to perform step 34 (e.g., an MBE apparatus) or another apparatus.

Figure 6:
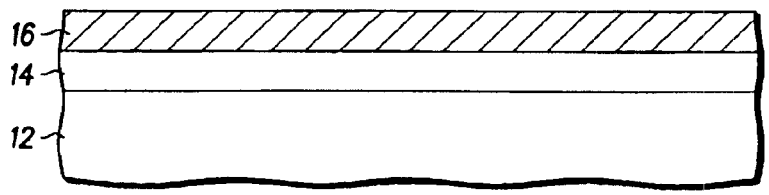
Figure 7:
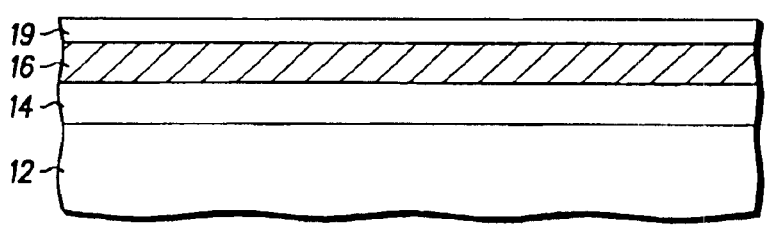

Template layer 16 is formed by depositing about 0.5 to about 2 monolayers of titanium onto the surface of layer 14 (step 38), as illustrated in FIG. 6. In the case where titanium is the deposited metal, step 38 is carried out at a temperature of about 25° C. to about 500° C. when layer 14 terminates with arsenic and about 25° C. to about 300° C. when layer 14 terminates with gallium. Template layer 16 includes the deposited titanium and may additionally include arsenic, gallium, and/or oxygen.

Step 38 may be performed using the same apparatus used for steps 34–36 or another apparatus. If step 38 is performed in another apparatus, layer 14 is preferably capped with arsenic to mitigate surface contamination and/or transferred in under vacuum to preserve the integrity of the surface.

Seed layer 19, having a thickness of about one to several monolayers, is epitaxially formed overlying layer 16 (step 40). Step 40 is preferably carried out at relatively low temperature—e.g., from about 25° C. to about 400° C., and preferably about 300° C. to about 350° C. at a partial pressure of molecular oxygen of about $10^{-8}$ to about $10^{-5}$ Torr to prevent unwanted degradation of layer 14 and/or substrate 12. Alternatively, the process can be carried out in an activated oxygen environment.

Figure 8:
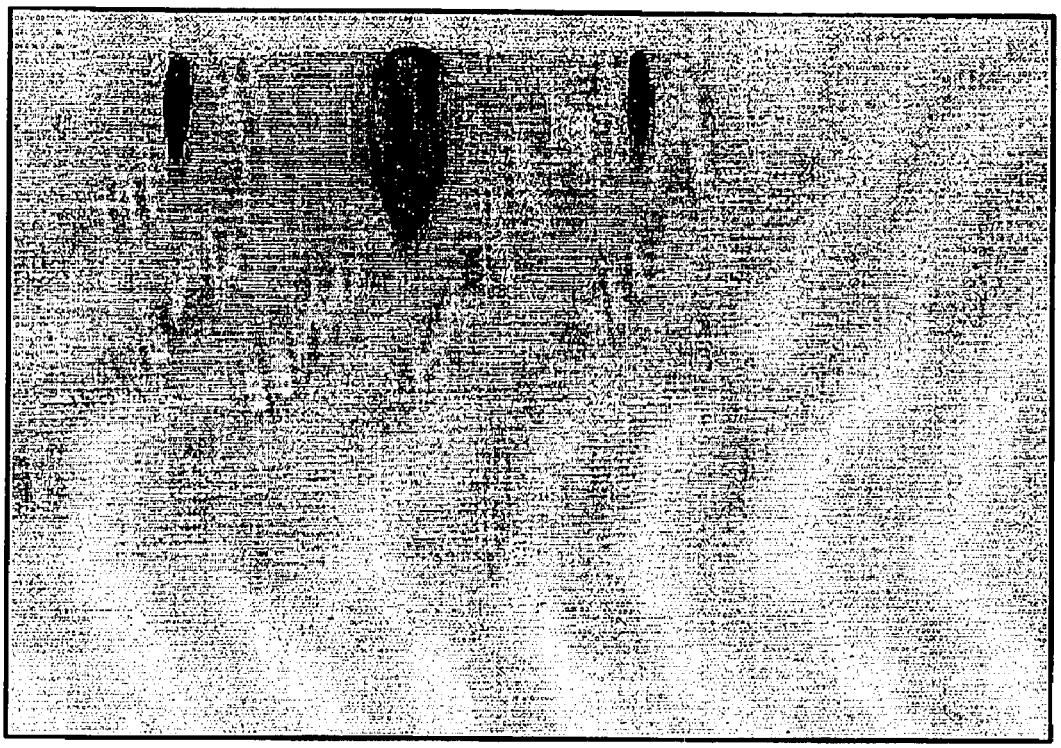
FIGS. 8–10 illustrate RHEED diffraction patterns of a strontium titanate film.
Figure 9:
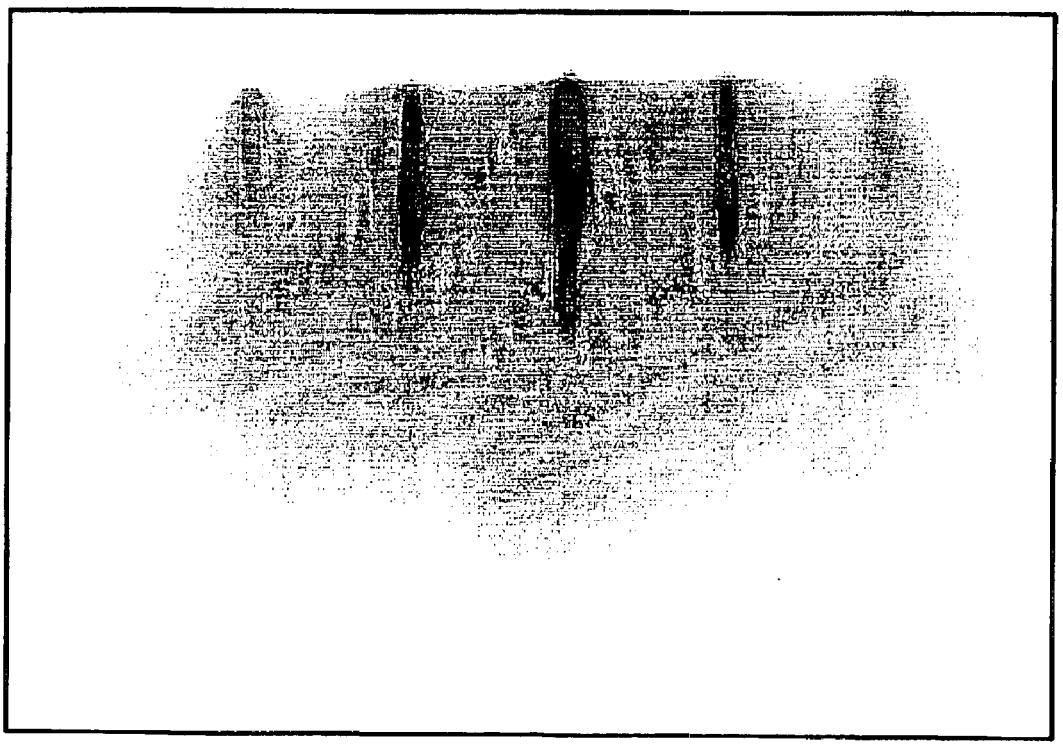
Figure 10:
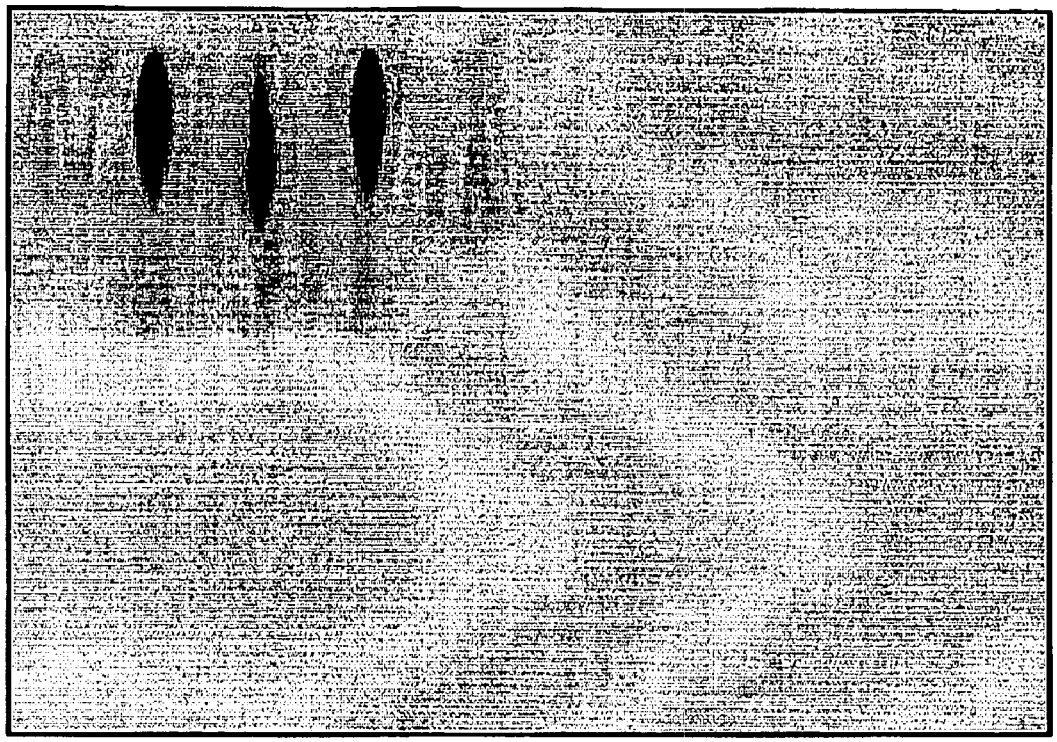
Figure 11:
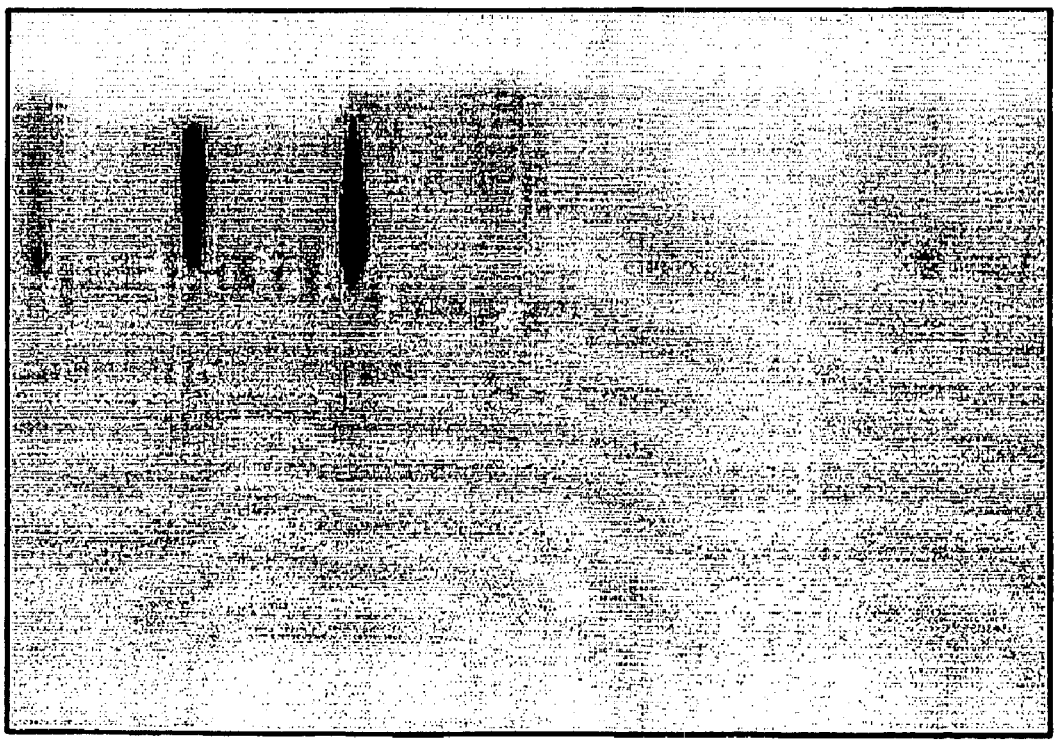
FIGS. 11–13 illustrate RHEED diffraction patterns of a barium titanate film.
Figure 12:
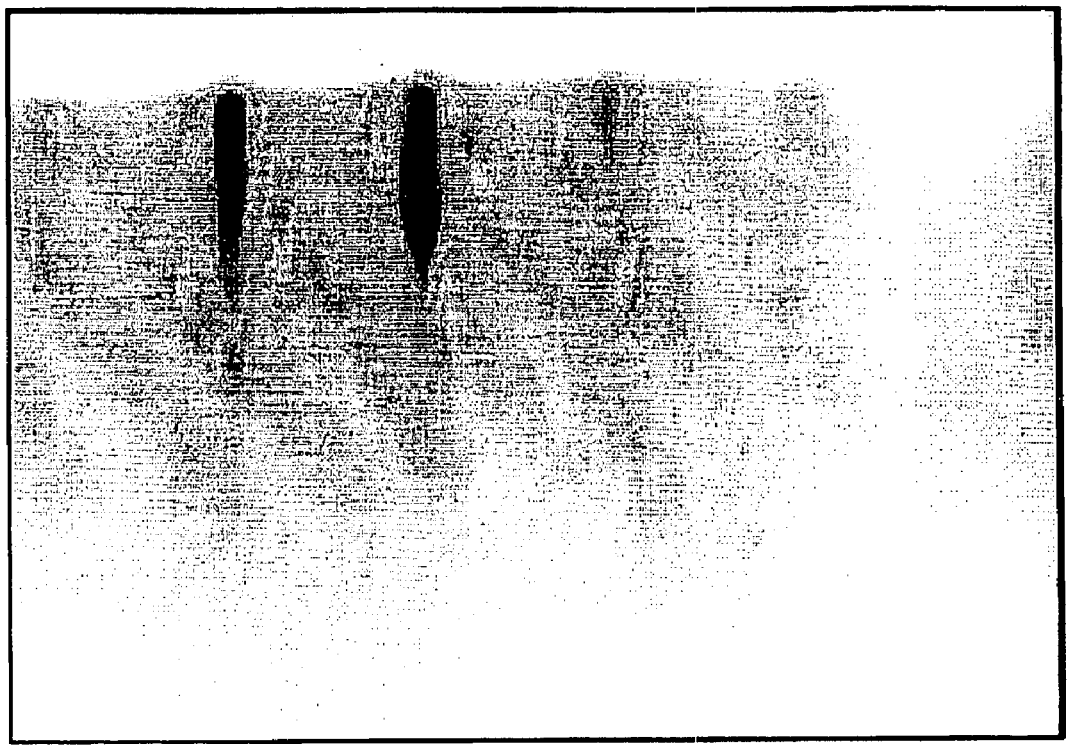
Figure 13:
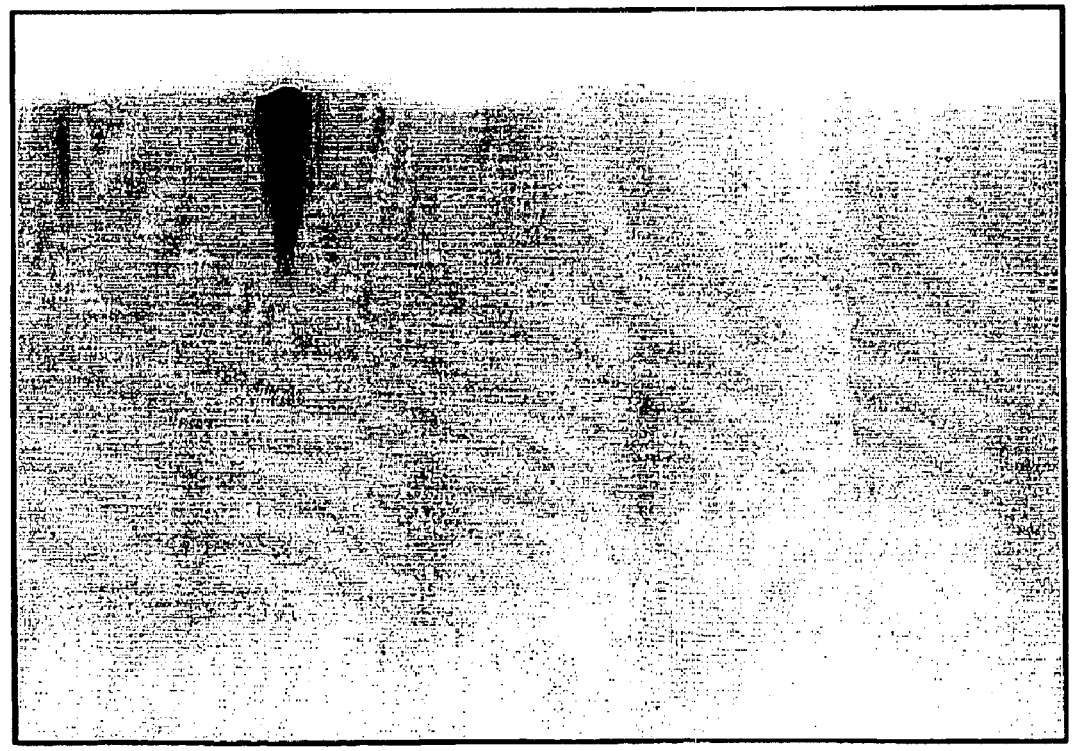

After seed layer 19 is at least partially formed, the structure is heated to a temperature of about 500 to about 620° C. and preferably about 550° C. under ultra high vacuum conditions to anneal layer 19 to provide a high-quality crystalline layer for subsequent processing. The crystalline quality of layer 19 can be monitored, for example, using in-situ RHEED diffraction analysis techniques. FIGS. 8–10 illustrate RHEED diffraction patters of a SrTiO$_3$ film. The sharp diffraction streaks in the [210], [110], and/or [100] directions indicate a smooth surface and a high degree of crystallinity of the SrTiO$_3$ film. FIGS. 11–13 illustrate similar RHEED diffraction patterns for a BaTiO$_3$ film.

Once seed layer 19 is formed, layer 18 (illustrated in FIG. 1) is grown at a relatively higher temperature—e.g., about 300° C. to about 620° C. with at a partial pressure of molecular oxygen of about $10^{-8}$ to about $10^{-5}$ Torr (step 44). If the deposition temperature is less than about 500° C., it may be desirable to periodically anneal layer 18, as discussed about in connection with step 42.

Figure 14:
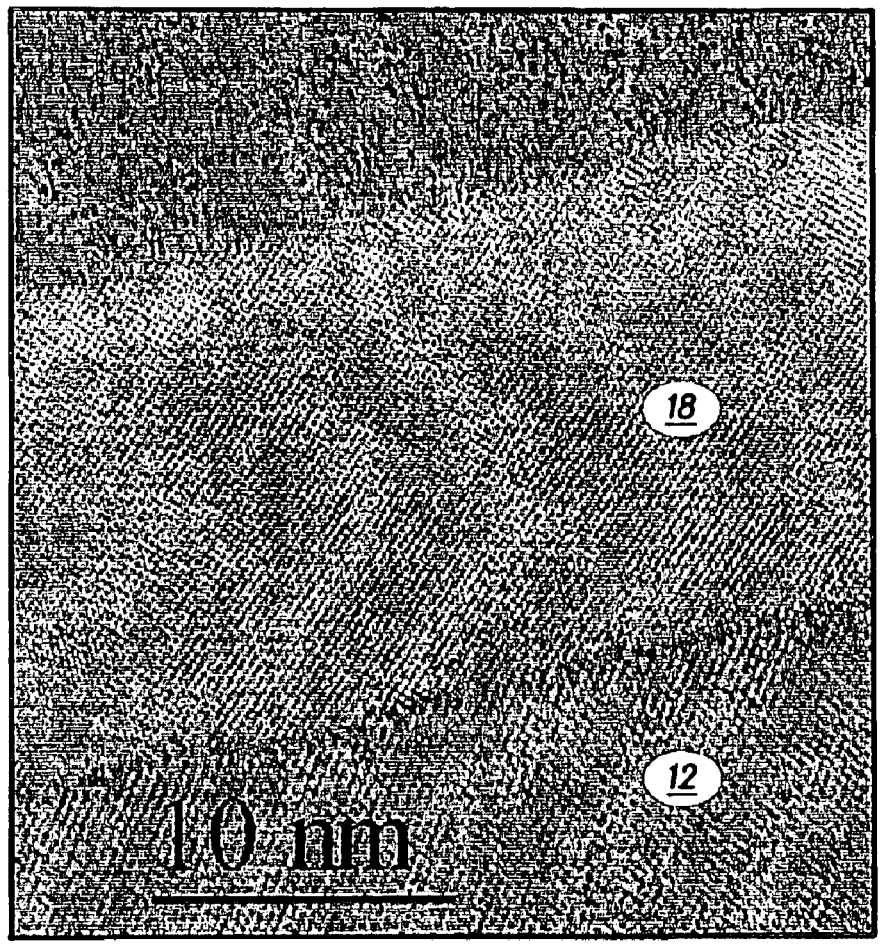
FIG. 14 illustrates a high resolution Transmission Electron Micrograph of a structure including a monocrystalline strontium titanate film.
Figure 15:
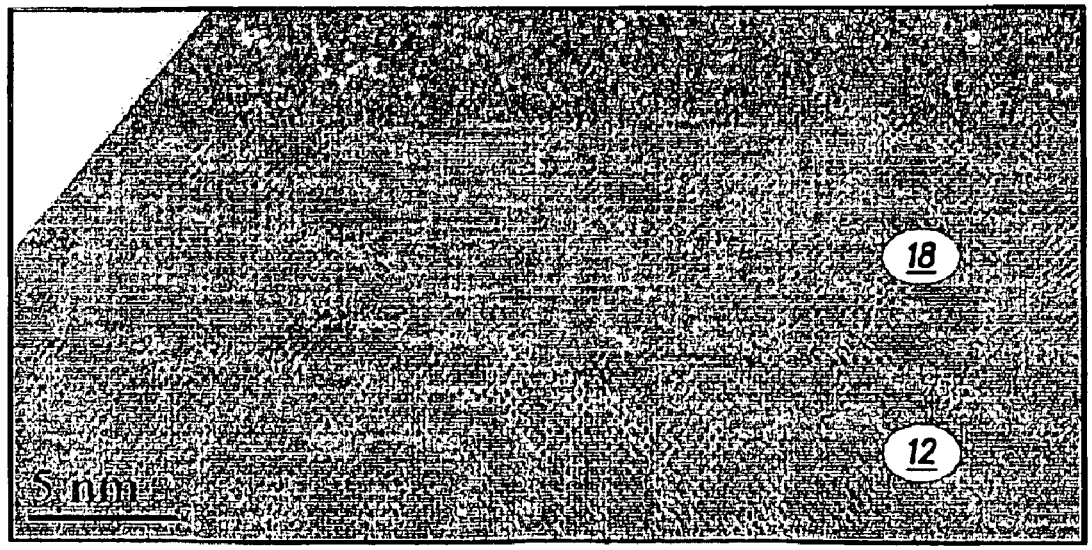
FIG. 15 illustrates a high resolution Transmission Electron Micrograph of a structure including a monocrystalline barium titanate film.
Figure 16:
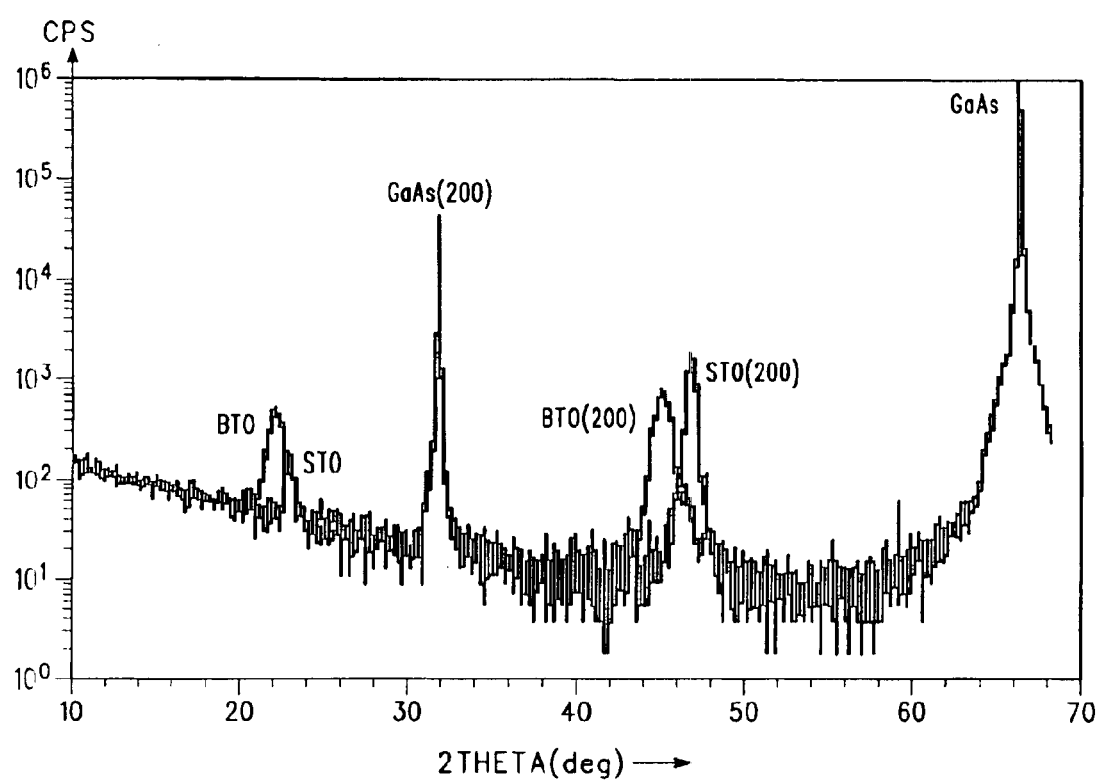
FIG. 16 illustrates an x-ray diffraction spectrum of a structure including a single crystal film of strontium titanate and barium titanate.

FIG. 14 is a high resolution Transmission Electron Micrograph (TEM) of material manufactured in accordance with one embodiment of the present invention, illustrating high-quality crystalline growth of strontium titanate layer 18 overlying gallium arsenide substrate 12 and FIG. 15 is a high resolution TEM, illustrating high-quality barium titanate overlying a GaAs substrate. FIG. 16 illustrates an x-ray diffraction spectra taken on a structure including $SrTiO_3$ and $BaTiO_3$ monocrystalline layers 18 grown on gallium arsenide substrates 12. The peaks in the spectrum indicate that both layers 18 and substrates 12 are monocrystalline.

The process described above illustrates a process for forming a semiconductor structure including a gallium arsenide substrate and an overlying monocrystalline oxide layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

Clearly, those embodiments specifically describing structures having compound semiconductor portions and oxide material portions are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A process for fabricating a semiconductor structure comprising:

providing a monocrystalline compound semiconductor substrate, the substrate including gallium arsenide and having a lattice structure;

forming an epitaxial layer of a compound semiconductor material overlying the substrate, the epitaxial layer including a monocrystalline gallium arsenide material with a surface terminating with either gallium or arsenic, wherein the gallium terminated surface has one of a 4×2, 6×2, or 3×2 surface structure, and wherein the arsenic terminated surface has one of a 2×4, or 4×4 surface structure, the epitaxial layer providing a smooth and contaminant free surface for subsequent processing;

depositing, at a temperature of about 25° C. to about 300° C., a metal selected from the group consisting of titanium, zirconium, and hafnium onto the epitaxial layer to form a template layer comprising the metal;

depositing, at a pressure of about $10^{-6}$ to about $10^{-5}$ Torr and at a temperature of about 25° C. to about 400° C., a seed layer comprising perovskite material onto the template layer;

heating the structure, at a temperature of up to about 620° C., to anneal the seed layer until the seed layer is monocrystalline; and epitaxially growing, at a temperature of about 300° C. to about 620° C. and at a pressure of about $10^{-6}$ to about $10^{-5}$ Torr, a monocrystalline oxide layer overlying the seed layer; the oxidelayer selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and combinations thereof, wherein the seed layer helps to initiate growth of the monocrystalline oxide layer, further wherein a lattice structure of the monocrystalline oxide layer exhibits a substantially 45 degree rotation with respect to the substrate lattice structure.

2. The process of claim 1, further comprising the step of heating the substrate to a temperature of about 550–620° C. to remove a native oxide from the surface of the substrate prior to the step of forming the epitaxial layer.

3. The process of claim 1, wherein the step of depositing a metal comprises depositing about one to about 2 monolayers of metal.

4. The process of claim 1, wherein the step of depositing a seed layer comprises depositing $Sr(Ba)TiO_3$.

5. The process at claim 1, wherein the step of depositing a seed layer comprises depositing strontium titanate.

6. The process of claim 1, wherein the step of depositing a seed layer comprises depositing barium titanate.

* * * * *

UNITED STATES PATENT AND TRADEMARK OFFICE
CERTIFICATE OF CORRECTION

PATENT NO. : 6,890,816 B2
APPLICATION NO. : 10/359879
DATED : May 10, 2005
INVENTOR(S) : Yong Liang et al.

It is certified that error appears in the above-identified patent and that said Letters Patent is hereby corrected as shown below:

In Column 8, Line 17, Claim No. 1:

Change "C." to --C--.

In Column 8, Line 18, Claim No. 1:

Change "C." to --C--.

In Column 8, Line 21, Claim No. 1:

Change "$10^{-6}$" to --$10^{-8}$--.

In Column 8, Line 22, Claim No. 1:

Change both occurrences of "C." to --C--.

In Column 8, Line 26, Claim No. 1:

Change "C." to --C--.

In Column 8, Line 29, Claim No. 1:

Change "C." to --C--.

In Column 8, Line 29, Claim No. 1:

Change "$10^{-6}$" to --$10^{-8}$--.

In Column 8, Line 31, Claim No. 1:

Change "oxidelayer" to --oxide layer--.

UNITED STATES PATENT AND TRADEMARK OFFICE
CERTIFICATE OF CORRECTION

PATENT NO. : 6,890,816 B2
APPLICATION NO. : 10/359879
DATED : May 10, 2005
INVENTOR(S) : Yong Liang et al.

It is certified that error appears in the above-identified patent and that said Letters Patent is hereby corrected as shown below:

In Column 8, Line 46, Claim No. 2:

Change "C." to --C--.

Signed and Sealed this

Twenty-fourth Day of April, 2007

JON W. DUDAS
*Director of the United States Patent and Trademark Office*